(12) United States Patent
Yen

(10) Patent No.: US 7,492,690 B2
(45) Date of Patent: Feb. 17, 2009

(54) STATISTICAL CIRCUIT

(75) Inventor: Kuang-Yu Yen, Taichung (TW)

(73) Assignee: Realtek Semiconductor Corp., Hsinchu (TW)

( * ) Notice: Subject to any disclaimer, the term of this patent is extended or adjusted under 35 U.S.C. 154(b) by 747 days.

(21) Appl. No.: 11/143,288

(22) Filed: Jun. 2, 2005

(65) Prior Publication Data

US 2005/0270940 A1 Dec. 8, 2005

(30) Foreign Application Priority Data

Jun. 2, 2004 (TW) .............................. 93115874 A

(51) Int. Cl.
*G11B 7/00* (2006.01)

(52) U.S. Cl. ............... 369/59.21; 369/59.17; 369/53.11

(58) Field of Classification Search ................ None
See application file for complete search history.

(56) References Cited

U.S. PATENT DOCUMENTS 4,908,771 A * 3/1990 Piot ............................ 327/26

* cited by examiner

*Primary Examiner*—Jorge L Ortiz Criado
(74) *Attorney, Agent, or Firm*—Thomas, Kayden, Horstemeyer & Risley

(57) ABSTRACT

The statistical circuit includes a pulse-width measuring unit, serially coupling delay units, a logical circuit and counters. The pulse-width measuring unit is for receiving a sampling signal and generating a pulse-width signal. A pulse occurs on the pulse-width signal as the sampling signal has status change. The delay units include a first delay unit for receiving the pulse-width signal and outputting delay signals according to the trigger of a reference clock. The output of the first delay unit is used as a reset signal. The logic circuit is for receiving the pulse-width signal and the reset signal and generating a counting signal. The counting signal is enabled for a period of time as a pulse occurs on the pulse-width signal. The counters are respectively for receiving the delay signals and counting the number of the received delay signals in a first status as the trigger signal is enabled.

16 Claims, 4 Drawing Sheets

STATISTICAL CIRCUIT

This application claims the benefit of Taiwan application Ser. No. 93115874, filed Jun. 2, 2004, the subject matter of which is incorporated herein by reference.

BACKGROUND OF THE INVENTION

1. Field of the Invention

The invention relates in general to a statistical circuit, and more particularly to a statistical circuit applied in a control chip.

2. Description of the Related Art

For the error detection of an optical disk system, an external apparatus is usually used to verify the quality of the whole system or an optical disk. The histogram apparatus capable of measuring the width of a pulse is often used for determining the disk quality and verifying the operation condition of the analog front end (AFE) of the optical disk system. FIG. 1 is a schematic diagram showing how the error detection of an optical disk system is executed by a histogram apparatus. As shown in FIG. 1, the data outputted by the optical disk system 11 are converted by the DUT 12 and then inputted to the histogram apparatus 13. Therefore, the characteristics of the optical disk system 11 can be determined according to the result displayed on the histogram apparatus 13.

However, the histogram apparatus is expensive and thereby not suitable for performing the error detection of the optical disk system.

SUMMARY OF THE INVENTION

It is therefore an object of the invention to provide a statistical circuit to solve the above-mentioned problem.

The invention achieves the above-identified object by providing a statistical circuit disposed in an optical disk drive for measuring the characteristics thereof. According to an embodiment of the invention, the statistical circuit includes a measuring unit, a plurality of delay units coupled together, a logical circuit, and a plurality of counters. The measuring unit is for receiving the sampling signal and generating a pulse width signal. A pulse of the pulse width signal corresponds to the change of the status of the sampling signal. The delay units include a first delay unit for receiving the pulse width signal and outputting several delay signals according to a reference clock. An output of the first delay unit is also used as a reset signal. The logic circuit is for receiving the pulse width signal and the reset signal and generating a counting signal. The counting signal is enabled for a period of time according to the pulse of the pulse width signal. The counters are respectively for receiving the delay signals and counting the number of the received delay signals with a first status during the counting signal enabled.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
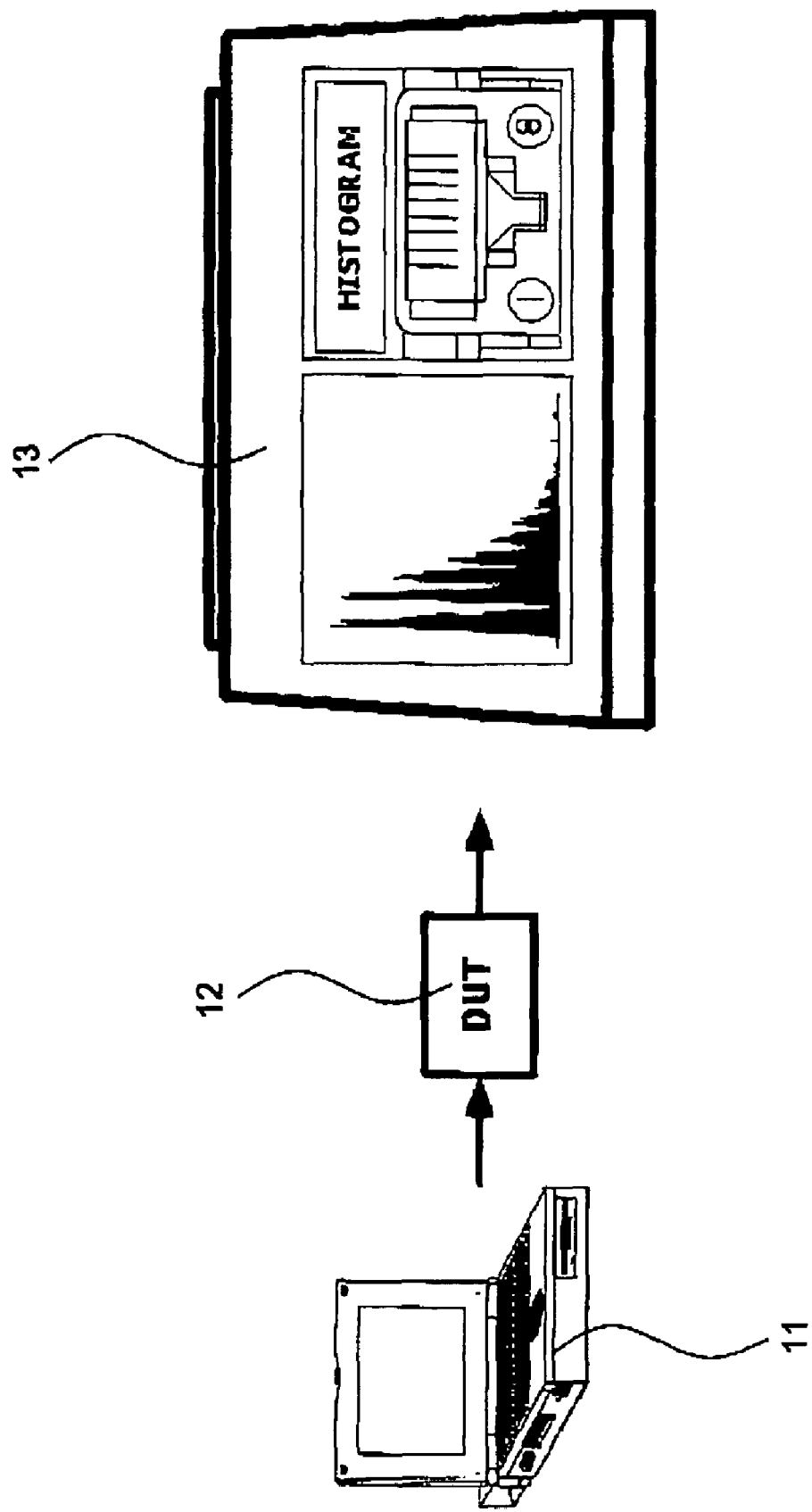
FIG. 1 (Prior Art) is a schematic diagram showing the detection of an optical disk drive system by using a histogram apparatus.
Figure 2:
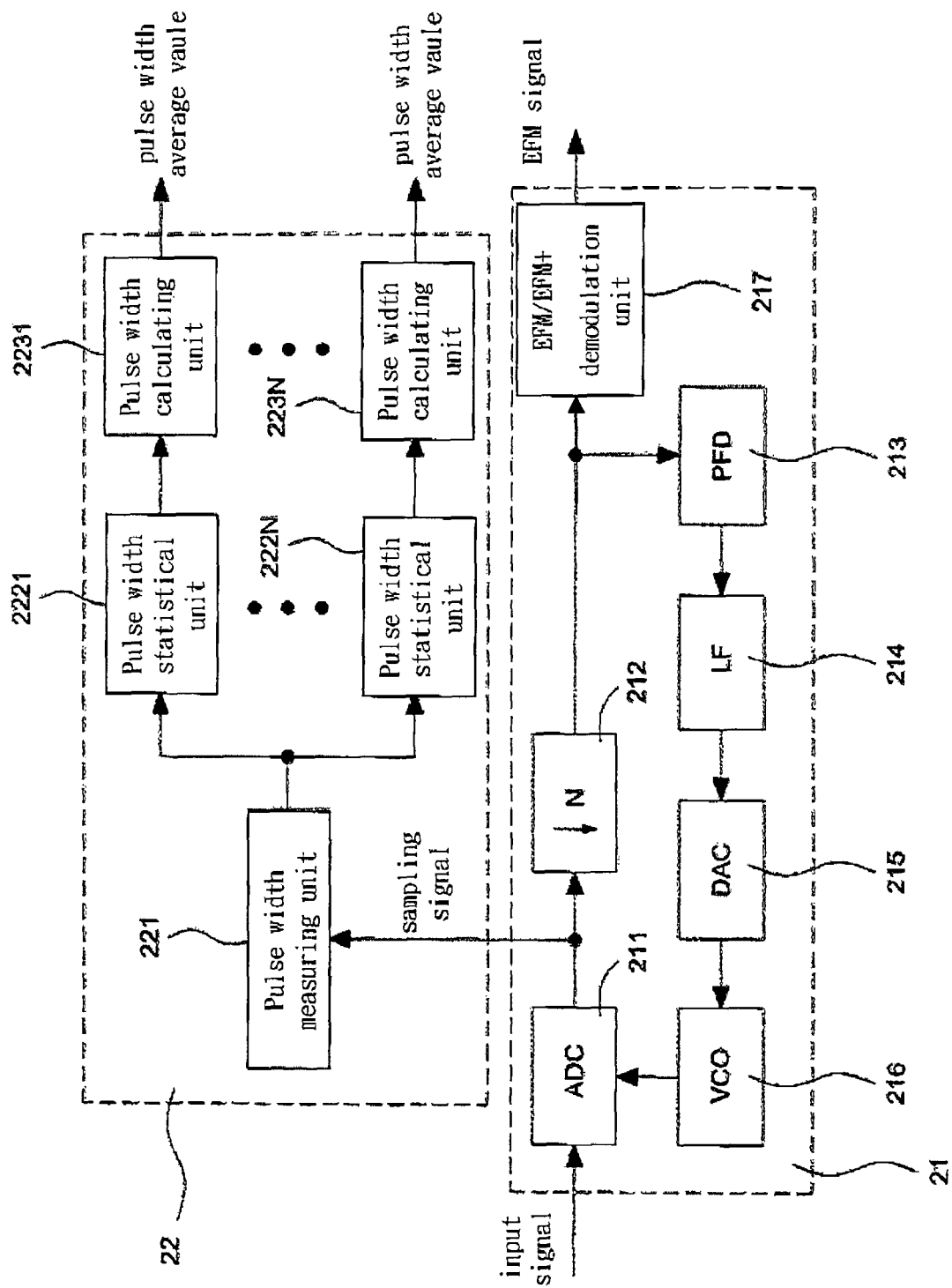
FIG. 2 is a functional block diagram of a statistical circuit disposed in a DVD control circuit according to an embodiment of the invention.

FIG. 2 shows a functional block diagram of a statistical circuit disposed in a control circuit such as a DVD control circuit according to an embodiment of the invention. As shown in FIG. 2, the DVD control circuit includes a control circuit 21 and a statistical circuit 22. In the conventional DVD control system, the RF signal recorded in an optical disk is amplified by a preamplifier and then inputted to the control circuit 21. The control circuit 21 includes an analog-to-digital converter (ADC) 211, a down converter unit 212, a phase frequency detector 213, a loop filter 214, a digital-to-analog detector (DAC) 215, a voltage controlled oscillator (VCO) 216, and an eight to fourteen modulation (EFM) demodulator 217. The control circuit 21 converts an input signal, i.e. the RF signal, to a digital sampling signal by utilizing the ADC 211 and fixes the frequency of the digital sampling signal by using a digital phase locked loop (DPLL). Generally speaking, the sampling frequency of the ADC 211 is higher than the frequency corresponding to the basic period T of an EFM signal, so the control circuit 21 uses the down converter unit 212 to reduce the frequency of the sampling signal outputted by the ADC 211 to that corresponding to the basic period T.

The statistical circuit receives the sampling signal and analyzes the number of the pulses with various pulse widths corresponding to the sampling signal, and outputs a statistical value or an average value of each kind of the pulse widths. The statistical circuit includes a pulse width measuring unit 221, several pulse width statistical units 2221~222N, and several pulse width calculating units 2231~223N. The pulse width measuring unit 221 measures the width of each pulse of the sampling signal and outputs the corresponding signal to the pulse width statistical unit 2221~222N. For example, when the pulse width measured by the pulse width measuring unit 221 is 3, the value of the pulse width statistical unit 2223 corresponding to the pulse width 3 is added by 1. Therefore, by using the pulse width statistical units 2221~222N, the numbers of the pulses with various pulse widths generated within a period of time can be recorded, respectively. Afterward, the pulse width calculating units 2231~223N are used to output the statistical values or the average values of all kinds of pulse widths according to the numbers recorded by the pulse width statistical units 2221~222N. Therefore, a firmware may be used to output the statistical values or the average values and an FAE (field application engineer) may utilize these statistical values or the average values to adjust the parameters of an optical disk system.

In the present embodiment, the control circuit 21 is applied in a high-speed optical disk system and the oscillating frequency of the VCO 216 shown in FIG. 2 reaches 530 MHz at the speed 20×, so the input signal corresponding to the speed 1× (the down multiple N of the down converter unit 212 is set as 20) can be sampled twenty times within a basic period T by utilizing the VCO 216. Consequently, the accuracy for measuring the pulse width of the sample signal is (1/20)×T which is enough for detecting the quality of the DVD control circuit, adjusting parameters of a DVD server system, and showing the writing quality of an optical disk.

Figure 3:
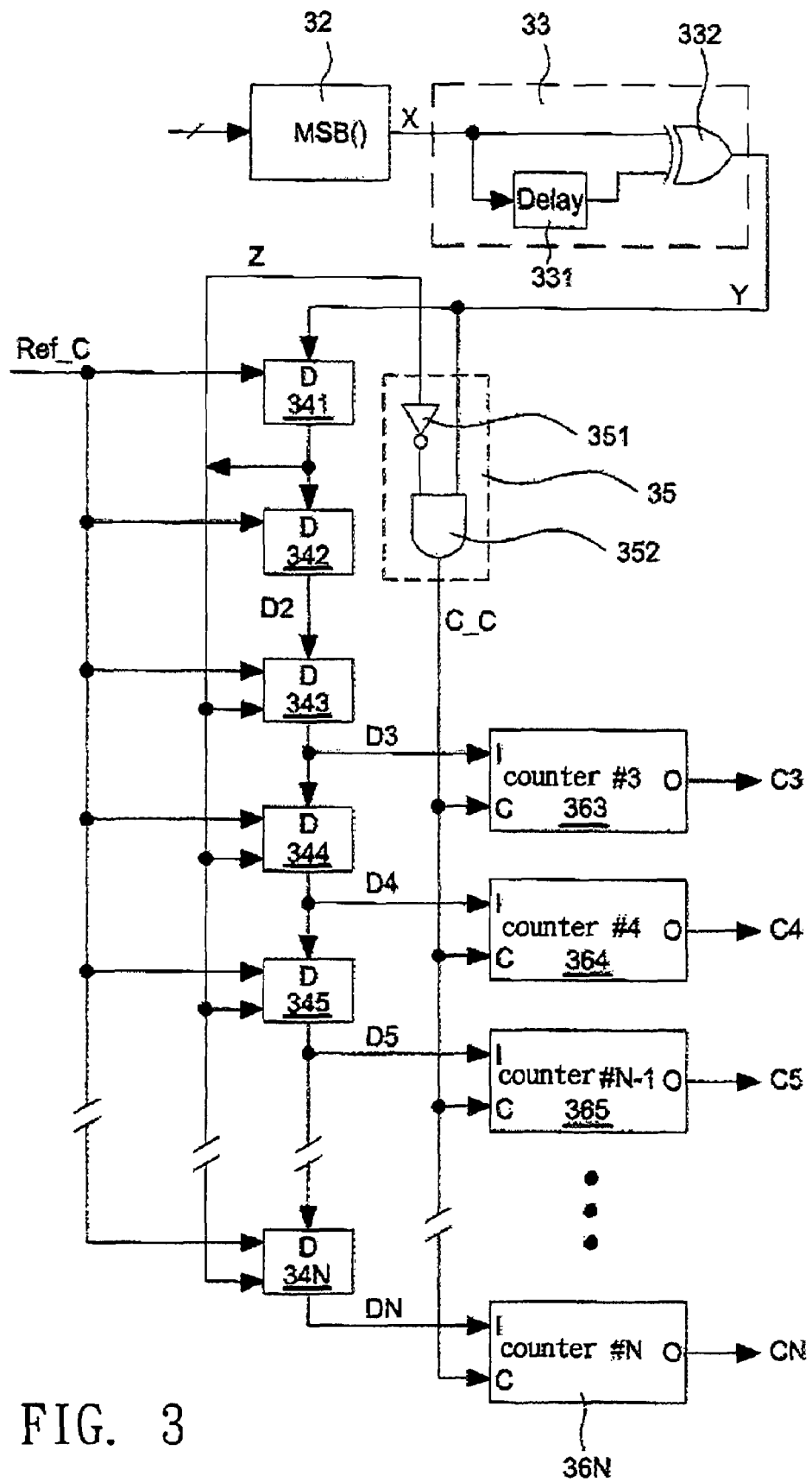
FIG. 3 is a detailed circuit of the statistical circuit 22 according to the embodiment of the invention.

FIG. 3 shows a detail circuit of the statistical circuit 22 according to an embodiment of the invention. As shown in FIG. 3, the statistical circuit 22 includes a most significant bit (MSB) extracting unit 32, a NRZI (non-return-to-zero inverted) unit 33, several D-type flip-flops 341~34N, a logical unit 35, and several counters 363~36N. In the embodiment, the sampling signal is a digital signal and the symbol of the most significant bit can be used to represent whether the signal changes or not. Therefore, this embodiment uses the most significant bit extracting unit 32 to receive the sampling signal and output the most significant bit data as a status signal X. However, if the sampling signal has only one bit, the most significant bit extracting unit 32 is not needed.

The NRZI unit 33 receives the status signal X and outputs a pulse signal Y according to the change of the status of the status signal X. In the embodiment, the NRZI unit 33 includes a delay unit 331 and an exclusive-or gate 332, but the invention is not limited thereto. The pulse signal Y is transmitted through the D-type flip-flops according to the reference clock Ref_C. Generally speaking, the frequency of the reference clock Ref_C is the same as the sampling frequency of the ADC 211 determined by the VCO 216. Accordingly, the frequency of the reference clock Ref_C is 20 times of the frequency corresponding to the basic period T.

The output of the D-type flip-flop 341 is not only used as an input signal of the flip-flop 342 but also a reset signal Z for resetting the flip-flops 343~34N. The logic unit 35 generates a counting clock C_C according to the signal Y and the reset signal Z. Each of the counters 363~36N has an input terminal I for receiving the output of the D-type flip-flops 343~34N and a trigger terminal C for receiving the counting clock C_C. Therefore, during a trigger terminal C of one of the counters 363~36N receiving the counting clock C_C, the counter with said trigger terminal C does not count if the voltage on the corresponding terminal I corresponds to a logical low L, but counts if the voltage on the corresponding terminal I corresponds to a logical high H. In the present embodiment, when a counter counts, the count value of the counter is added by one.

In the circuit of FIG. 3, the number of the flip-flops and the counters is related to the sampling frequency of the ADC. Basically, the higher the sampling frequency, the more flip-flops and counters are required, and the higher pulse accuracy is obtained. For example, if the sampling frequency is 20×, twenty flip-flops and counters are needed to support each basic period T.

Figure 4:
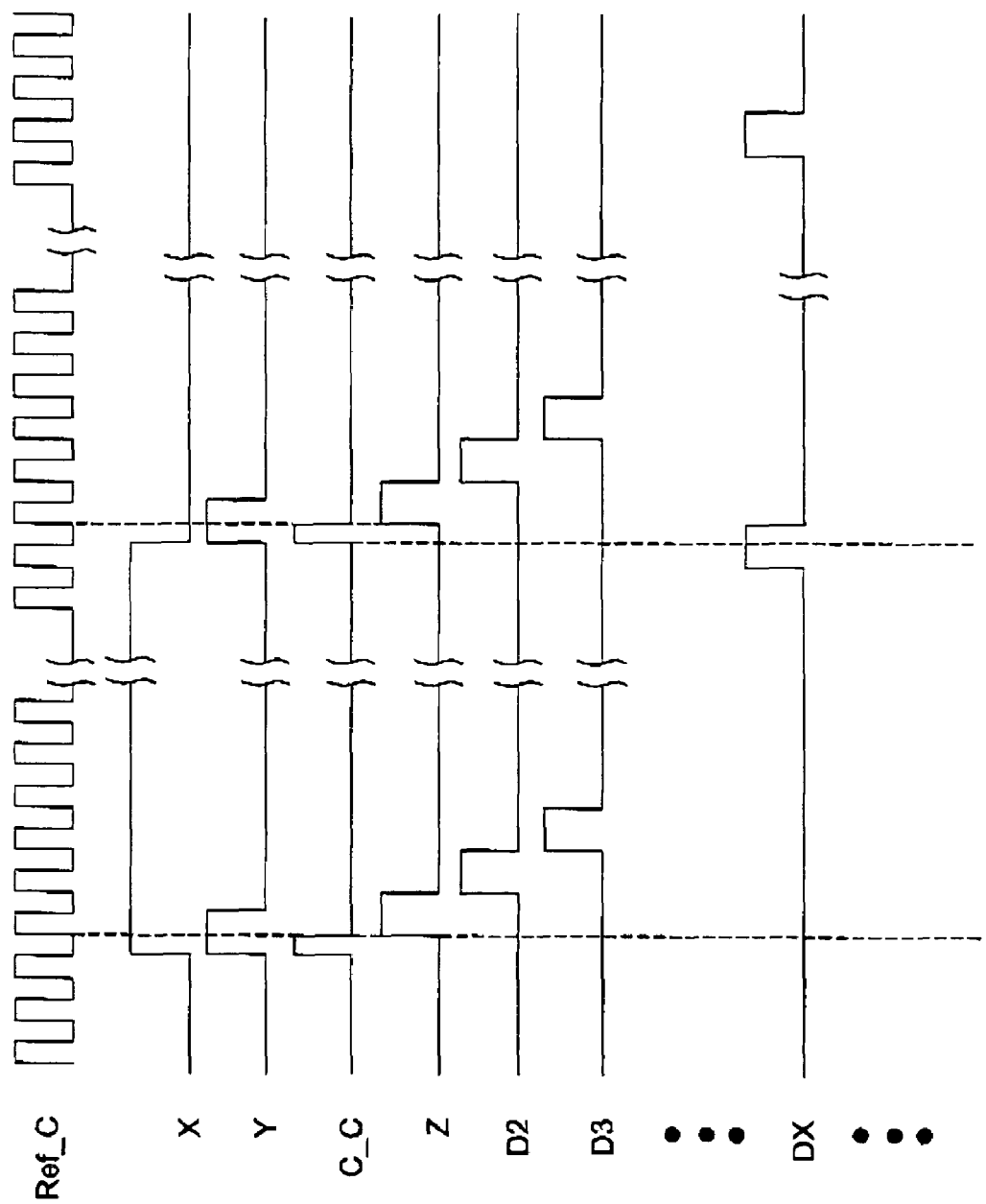
FIG. 4 is a timing diagram of partial signals in FIG. 3.

FIG. 4 shows a timing diagram of partial signals in FIG. 3, said partial signals including the reference clock Ref_C, the status signal X, the pulse signal Y, the reset signal Z, and delay signals D2~DX. When the status signal X changes from the logical high H to the logical low L or the other way round, it represents one pulse is ended and the next pulse is initialized. At this time, the pulse signal Y changes from L to H, and the counting clock C_C is correspondingly enabled, i.e. changed from L to H. Therefore, during the counting clock C_C enabled, one of the counters has its count value added by one, and the rest have an unchanged count value. For example, in the timing diagram of FIG. 4, the X-th counter has the count value added by one according to the enabled counting clock C_C. Moreover, when the pulse signal Y is changed from L to H, the voltage on the input terminal of the flip-flop 341 is also changed to the logical high H. Consequently, at the front edge of the next reference clock Ref_C, the reset signal Z outputted by the flip-flop 341 is enabled, that is, the reset signal Z changed to the logical high H. When the reset signal Z is enabled, the counting clock C_C is disabled and the flip-flops 343~34N are reset to be at the logical low L. Afterwards, at the front edge of each reference signal Ref_C, the outputs of flip-flops 343~34N are sequentially changed from L to H and then from H to L.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A statistical circuit disposed in an optical storage apparatus for measuring the statistical value of a pulse width corresponding to a sampling signal, the statistical circuit comprising:
   a measuring unit for receiving the sampling signal and generating a first signal, wherein the measuring unit generates a second signal according to the change of the status of the sampling signal;
   a statistical unit for counting a statistical number according to the first signal and the second signal, wherein the statistical unit corresponds to the pulse width of the sampling signal;
   at least a calculating unit for receiving one or more output values of the statistical unit and thereby calculating and outputting an average value.

2. A statistical circuit for measuring the number of the pulses with various pulse widths corresponding to a sampling signal in a statistical period of time, the statistical circuit comprising:
   a measuring unit for receiving the sampling signal and generating a pulse width signal, wherein a pulse of the pulse width signal corresponds to the change of the status of the sampling signal;
   a plurality of delay units coupled together comprising a first delay unit, said delay units used for receiving the pulse width signal and outputting a plurality of delay signals according to a reference clock, wherein an output of the first delay unit is used as a reset signal;
   a logic circuit for generating a counting signal according to the pulse width signal and the reset signal, wherein the counting signal is enabled for a period of time according to the pulse of the pulse width signal; and
   a plurality of counters for respectively receiving the plurality of delay signals and counting the number of the received delay signals with a first status as the counting signal is enabled.

3. The statistical circuit according to claim 2, wherein the first status corresponds to logical high.

4. The statistical circuit according to claim 2, wherein the delay units are flip-flops.

5. The statistical circuit according to claim 2, wherein the logical circuit comprises:
   an inverter for receiving the reset signal and outputting an inverting signal; and
   an and gate for receiving the inverting signal and the pulse width signal, and outputting the counting signal.

6. The statistical circuit according to claim 2, wherein each counter receives a clear signal for resetting the count value of each counter.

7. A control chip having a statistical circuit, the statistical circuit used for measuring the number of the pulses of a sampling signal in a statistical period of time, the statistical circuit comprising:
   a measuring unit for receiving the sampling signal and generating a pulse width signal, wherein a pulse of the pulse width signal corresponds to the change of the status of the sampling signal;

a statistical unit for receiving the pulse width signal, measuring the number of the pulses of the pulse width signal, and outputting the number of the pulses of the pulse width signal; and at least a calculating unit for receiving one or more output values of the statistical unit and thereby calculating and outputting an average value.

8. A statistical circuit disposed in an optical storage apparatus for measuring the pulse width of a sampling signal, the statistical circuit comprising:

a measuring unit for outputting a pulse width signal according to the pulse width of the sampling signal;

a plurality of serially coupled delay units for respectively outputting a plurality of delay signals, the delay units comprising a first delay unit for outputting a reset signal according to the pulse width signal and a reference clock;

a logical circuit for generating a counting signal according to the pulse width signal and the reset signal; and a plurality of counters for respectively receiving the delay signals, wherein one of the counters counts according to the counting signal.

9. The statistical circuit according to claim 8, wherein the delay units are flip-flops.

10. The statistical circuit according to claim 8, wherein the logical circuit comprises:

an inverter for receiving the reset signal and outputting an inverting signal; and a logic gate for receiving the inverting signal and the pulse width signal, and outputting the counting signal.

11. The statistical circuit according to claim 8, wherein each counter receives a clear signal for resetting the count value of each counter.

12. A control circuit disposed in an optical storage apparatus, comprising:

an analog-to-digital converter (ADC) for outputting a sampling signal according to an analog signal;

a phase locked loop (PLL) for outputting a sample adjusting signal to adjust the ADC according to the sampling signal;

an eight to fourteen modulation (EFM) demodulator for performing an eight to fourteen demodulation on the sampling signal; and a pulse width statistical unit, for measuring the pulse width of the sampling signal and doing statistics to the pulse width of the sampling signal, comprising;

a measuring unit for outputting a pulse width signal according to the pulse width of the sampling signal;

a plurality of serially coupled delay units for respectively outputting a plurality of delay signals, the delay units comprising a first delay unit for outputting a reset signal according to the pulse width signal and a reference clock;

a logical circuit for generating a counting signal according to the pulse width signal and the reset signal; and a plurality of counters for respectively receiving the delay signals, wherein one of the counters counts according to the counting signal.

13. The control circuit according to claim 12, wherein the control circuit further comprises a frequency divider for outputting a frequency dividing sampling signal to the EFM demodulator according to an output signal of the sampling circuit.

14. A statistical circuit disposed in an optical disk drive for measuring the characteristics of said optical disk drive, the statistical circuit comprising:

a measuring unit for generating a first signal according to the width of a pulse of a sampling signal; and a plurality of statistical units for respectively recording a statistical number and one of the statistical units counting according to the first signal; and a plurality of calculating units for receiving the statistical numbers of the statistical units respectively and thereby outputting a plurality of average values respectively.

15. The statistical circuit according to claim 14, wherein the sampling signal comprises a plurality of pulses with various widths, and the statistical number recorded by each of the statistical units respectively corresponds to each of the widths.

16. The statistical circuit according to claim 14, wherein the sampling signal is generated according to an input signal read from an optical disk.

* * * * *